(12) United States Patent
Fatemizadeh et al.

(10) Patent No.: US 7,235,827 B2
(45) Date of Patent: Jun. 26, 2007

(54) VERTICAL POWER JFET WITH LOW ON-RESISTANCE FOR HIGH VOLTAGE APPLICATIONS

(75) Inventors: Badredin Fatemizadeh, San Jose, CA (US); Ali Salih, Mesa, AZ (US)

(73) Assignee: Power-One, Inc., Camarillo, CA (US)

( * ) Notice: Subject to any disclaimer, the term of this patent is extended or adjusted under 35 U.S.C. 154(b) by 65 days.

(21) Appl. No.: 10/828,773

(22) Filed: Apr. 20, 2004

(65) Prior Publication Data

US 2005/0230745 A1 Oct. 20, 2005

(51) Int. Cl.
*H01L 29/80* (2006.01)
(52) U.S. Cl. ............... 257/256; 257/213; 257/E29.242
(58) Field of Classification Search .............. 257/504, 257/287, 134
See application file for complete search history.

(56) References Cited

U.S. PATENT DOCUMENTS

| | | | |
|---|---|---|---|
| 5,597,765 A * | 1/1997 | Yilmaz et al. ............ 438/270 |
| 5,702,987 A * | 12/1997 | Chen et al. ............... 438/187 |
| 6,551,865 B2 * | 4/2003 | Kumar et al. | |
| 6,774,417 B1 * | 8/2004 | Lin et al. | |
| 6,841,812 B2 * | 1/2005 | Zhao ............................ 257/256 |
| 6,855,970 B2 * | 2/2005 | Hatakayama et al. | |

* cited by examiner

*Primary Examiner*—Leonardo Andujar
*Assistant Examiner*—Kevin Quinto
(74) *Attorney, Agent, or Firm*—Robert D. Atkins; Quarles & Brady LLP

(57) ABSTRACT

A junction field effect transistor (JFET) has a gate region, drain region, and a source region. An epitaxial region having a first conductivity type is disposed over the drain region. The first conductivity type is N-type semiconductor material. The gate region is disposed within a trench which is formed in the epitaxial region. A P+ region is disposed within the epitaxial region and under the gate region. The P+ region has a first doping concentration of a second conductivity type opposite the first conductivity type. A P− region is disposed under the P+ region. The P− region has a second doping concentration of the second conductivity type which is less than the first doping concentration. The P− region may be disposed adjacent to a first portion of the P+ region while another P− region is disposed adjacent to a second portion of the P+ region. The P+ region may be implanted from the gate region deep into the epitaxial region.

7 Claims, 2 Drawing Sheets

US 7,235,827 B2

VERTICAL POWER JFET WITH LOW ON-RESISTANCE FOR HIGH VOLTAGE APPLICATIONS

FIELD OF THE INVENTION

The present invention relates in general to semiconductor devices and, more particularly, to a vertical power JFET having low on-resistance for high voltage applications.

BACKGROUND OF THE INVENTION

Junction field effect transistors (JFETs) are commonly used in power transistor and switching applications such as power supplies, power converters, energy systems, telecommunications, motor control, automotive, and consumer electronics. Power devices generally refer to transistors and other semiconductor devices that can switch about 1.0 ampere or more of conduction current. Power JFETs are well known as high input impedance, voltage controlled devices, which require only a small charge to initiate turn-on from relatively simple drive circuitry. Ideally, power JFETs should exhibit high drain to source current carrying capacity, low drain to source resistance ($R_{DSon}$) to reduce conduction losses, high switching rate with low switching losses, and high safe operating range (SOA) which provides the ability to withstand a combination of high voltage and high current.

Most if not all known power JFETs have a relatively thick drift or epitaxial (epi) region for high voltage isolation in the depletion layer, i.e., for a high breakdown voltage. The epi region also has a relatively low doping concentration. The combination of relatively thick epi and low doping concentration tends to increase the $R_{DSon}$ of the JFET. The higher the voltage application, the thicker the epi region needed for isolation. The thicker the epi region, the higher the $R_{DSon}$. A higher $R_{DSon}$ increases the switching losses and decreases the efficiency of the JFET in high voltage power switching applications. The relationship between thick epi for high voltage isolation and high $R_{DSon}$ may impose practical limitations of about 60 volts for high voltage applications using known JFET devices.

A need exists for JFETs with lower drain-source resistance for use in high voltage applications.

SUMMARY OF THE INVENTION

In one embodiment, the present invention is a semiconductor device having a gate region and comprising an epitaxial region having a first conductivity type. A first region is disposed within the epitaxial region and under the gate region. The first region has a first doping concentration of a second conductivity type opposite the first conductivity type. A second region is disposed under the first region. The second region has a second doping concentration of the second conductivity type which is less than the first doping concentration.

In another embodiment, the present invention is a semiconductor device having a gate region and comprising an epitaxial region having a first conductivity type. A first region is disposed within the epitaxial region and under the gate region. The first region has a first doping concentration of a second conductivity type opposite the first conductivity type. A second region is disposed adjacent to a first portion of the first region. The second region has a doping concentration of the second conductivity type which is less than the first doping concentration.

In yet another embodiment, the present invention is a semiconductor device having a first gate region. An epitaxial region has a first conductivity type. A first region is disposed within the epitaxial region, under the first gate region, and extending at least half way through the epitaxial region. The first region has a second conductivity type opposite the first conductivity type.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims.

Figure 1:
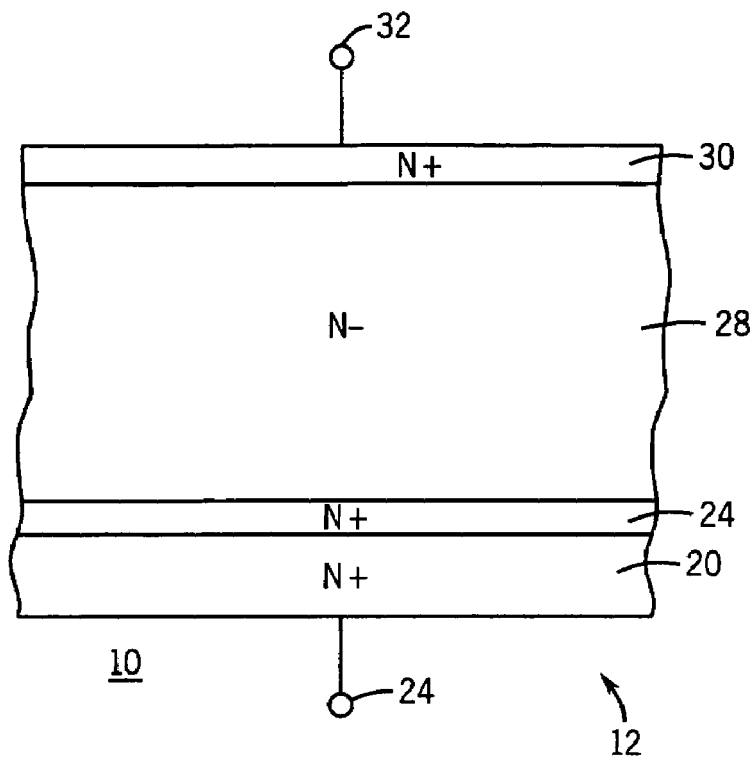
FIG. 1 is a cross-sectional view of initial construction phases of a vertical power JFET.

Referring to FIG. 1, a cross-sectional view of semiconductor device 10 is shown suitable for silicon-based semiconductor manufacturing processes. Semiconductor 10 may also be formed with other technologies and materials such silicon carbide (SiC) and gallium arsenide (GaAs). Semiconductor device 10 is generally useful and applicable to insulated gate transistors and devices, including junction field effect transistors (JFETs) and insulated gate field effect transistors (IGFETs).

Semiconductor device 10 is particularly applicable to power semiconductor devices, i.e., devices that can switch about 0.5 to 1.0 amperes or more conduction current with an applied drain voltage between 5 volts and hundreds of volts. A typical applied gate voltage ranges between 1 to 20 volts. The power JFET is one type of power semiconductor device which exhibits high drain-source current carrying capacity, low $R_{DSon}$ to reduce conduction losses, high switching rate with low switching losses, and high SOA which provides the ability to withstand a combination of high voltage and high current.

In other embodiments, semiconductor device 10 may be formed using gallium-arsenide processes to produce JFETs and metal semiconductor field effect transistors (MESFETs). Semiconductor device 10 may be formed using silicon germanium processing technology. Some of the applications for power semiconductor devices include power supplies, power converters, energy systems, telecommunications, motor control, automotive, and consumer electronics.

In one embodiment, semiconductor device 10 is a vertical power JFET 12 having low $R_{DSon}$ and high breakdown voltage. Semiconductor device 10 as shown in the figures is not necessarily drawn to scale for purposes of illustration and may differ in relative proportions in practice. In the figures, common reference numerals are used for elements that provide the same or similar function. The order of the processing steps may differ from the construction method described herein.

The cross-sectional view of the initial stages of construction of vertical power JFET 12 is shown in FIG. 1. Although JFET 12 is made as an n-channel device, fabrication of p-channel device would follow directly using opposite polarities. A relatively thick drain region or layer 20 is formed in a silicon-based substrate to operate as the drain of JFET 12. An electrode or terminal 22 provides electrical contact to drain region 20. Drain region 20 is doped to have an n-type conductivity with high doping concentration, on the order of $10^{19}$ atoms arsenic/centimeter $(cm)^3$, to provide low electrical resistance to current flow. An extended or second drain region or layer 24 is formed on drain region 20 and doped to have an n-type conductivity with higher doping concentration, on the order of $10^{20}$ atoms arsenic/centimeter $(cm)^3$. The extended drain region 24 is about 0.3 micrometers ($\mu$m) in thickness. As noted, the dimensions shown in the figures are not necessarily drawn to scale.

Epitaxial (epi) region or layer 28 is formed on extended drain region 24. Epi region 28 has an n-type conductivity with a lighter doping concentration, on the order of $10^{15}$ atoms phosphorus/$cm^3$. Epi region 28 is made about 12-15 $\mu$m in thickness, depending on the high voltage application. A source region or layer 30 is formed on epi region 28 to operate as the source of JFET 12. An electrode or terminal 32 provides electrical contact to source region 30. Source region 30 is doped to have an n-type conductivity with higher doping concentration, on the order of $10^{20}$ atoms arsenic/centimeter $(cm)^3$.

Figure 2:
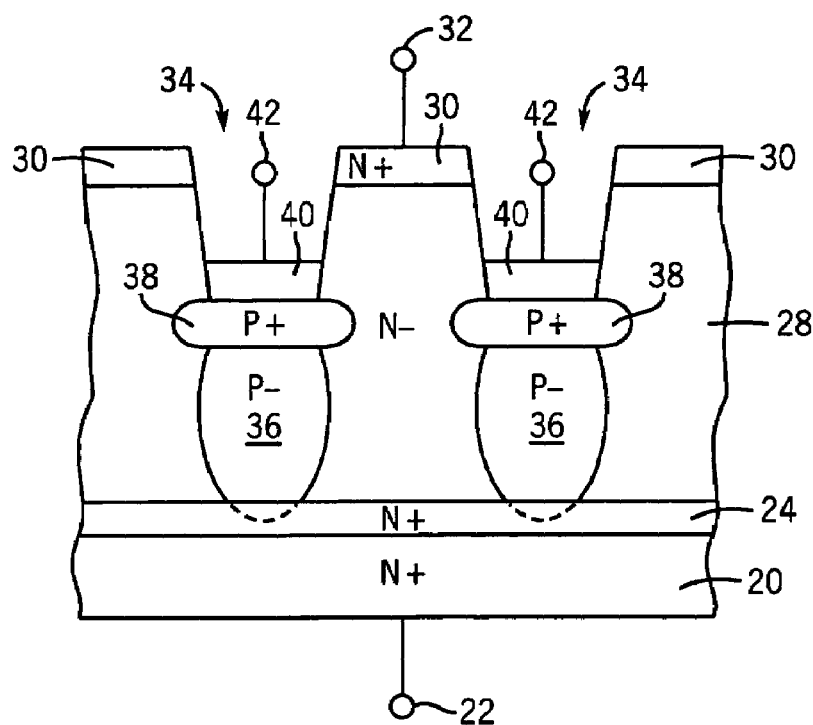
FIG. 2 illustrates a cross-sectional view of the vertical power JFET with P− regions under P+ regions.

In FIG. 2, a plurality of trenches or recessed areas 34 are etched through source region 30 and down into a portion of epi region 28. Trenches 34 are about 0.7 $\mu$m in width, 1.0 $\mu$m in depth, and spaced apart about 0.7 $\mu$m. Trenches 34 provide for higher integration of the vertical transistor(s), i.e., more devices per unit area.

Semiconductor regions 36 are implanted in epi region 28 in an area residing under what will become gate structures 40. The implantation of semiconductor region 36 is done with a high-energy ion implanter, MeV, plasma doping, or other suitable semiconductor manufacturing equipment capable of driving ions deep down into the lower areas of epi region 28. Semiconductor regions 36 are lightly doped with p-type semiconductor material, for example $10^{15}$ atoms boron/$cm^3$ and, as such, are also designed as P– regions 36. The doping concentration in P– regions 36 should be respectively larger than that of epi region 28. In one embodiment, P–regions 36 stop before reaching extended drain region 24. In another embodiment, P–regions 36 extend down into drain region 24 or drain region 20.

Semiconductor regions 38 are also implanted in epi region 28 above P– regions 36 and below gate structures 40. Semiconductor regions 38 are more heavily doped with p-type semiconductor material, for example $10^{19}$ atoms boron/$cm^3$ and, as such, are designed as P+ regions 38. In one embodiment, P+ regions 38 make physical contact with respective P–regions 36. In another embodiment, there may be a separation between P– regions 36 and P+ regions 38.

Gate structures or regions 40 are formed in trenches 34 over P+ regions 38. Gate structures 40 make physical contact with P+ regions 38. Electrodes or terminals 42 provide electrical contact to gate structures 40. Gate structures 40 may be formed in separate trenches 34, or gate structures 40 may be part of one continuous gate structure.

A feature of vertical JFET 12 is the adjacent regions of different doping concentration, e.g., P– regions 36 and P+ regions 38, within the voltage-sustaining or isolation layer, i.e., epi region 28. By adding P– regions 36 having opposite doping type with respect to epi region 28, the doping integral remains smaller than the material-specific breakthrough charge. The electric field inside the semiconductor structure is fixed by the net charge of the two opposite doped regions. For higher blocking voltages, the depth of the regions may be increased without altering the doping concentration, which gives rise to a linear relationship between blocking voltage and on-resistance. The linear relationship between blocking voltage and on-resistance in an improvement over the prior art. Presence of P– regions effectively reduces epi doping concentration and thus enable higher breakdown voltage. Conversely, desired breakdown voltage can be obtained using epi with much higher carrier concentration and smaller thickness, which provide significant reduction in Rdson.

Figure 3:
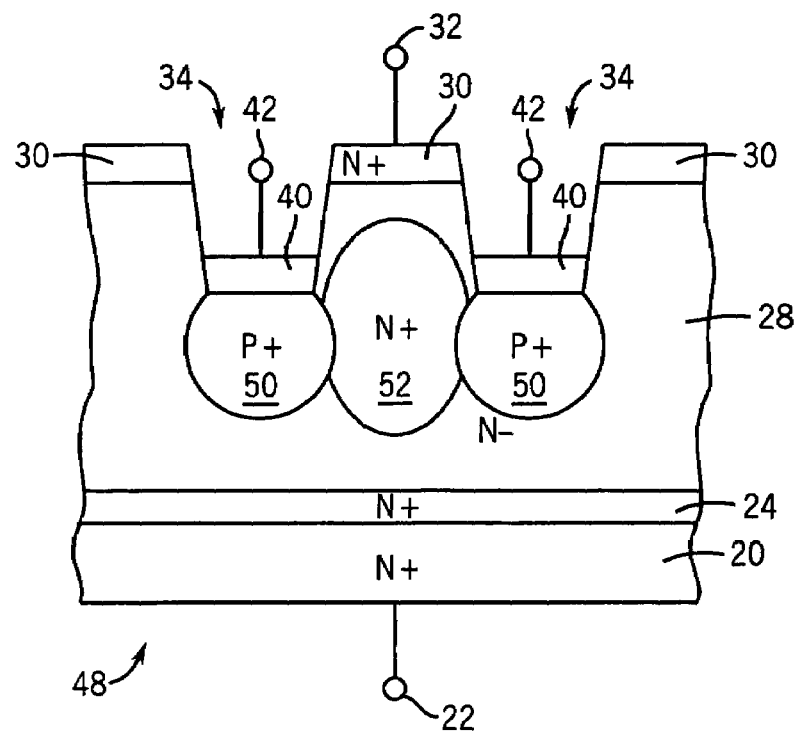
FIG. 3 illustrates a cross-sectional view of a second embodiment of the vertical power JFET with N+ region between deep P+ regions.

Turning to FIG. 3, a cross-sectional view of vertical JFET 48 is shown. Device structures having a similar function are assigned the same reference numbers used in FIG. 2. Semiconductor regions 50 are disposed in epi region 28 below gate structures 40. Semiconductor regions 50 are heavily doped with p-type semiconductor material, for example $10^{19}$ atoms boron/$cm^3$ and, as such, are designed as P+ regions 50. In one embodiment, P+ regions 50 make physical contact with gate structures 40. P+ regions 50 are made wider than gate structures 40 and extend down more than half way through epi region 28 between gate structures 40 and extended drain region 24. In one embodiment, P+ regions 50 extend through 50-75% of epi region 28 between gate structures 40 and extended drain region 24.

Semiconductor region 52 is formed in epi region 28 between P+ regions 50. Semiconductor region 52 is heavily doped with n-type semiconductor material, for example $10^{19}$ atoms arsenic/$cm^3$ and, as such, is designed as N+ region 52. In one embodiment, N+ region 52 makes physical contact with P+ regions 50. N+ regions 52 compensate for the electric field between P+ regions 50.

A feature of vertical JFET 48 is the formation of P+ regions 50 deep into epi region 28. P+ regions 50 have sufficient depth into epi region 28 to effectively reduce the doping concentration and thickness of epi region 28 under gate structures 40 and give JFET 48 lower $R_{DSon}$, while maintaining higher breakdown or isolation voltages.

Figure 4:
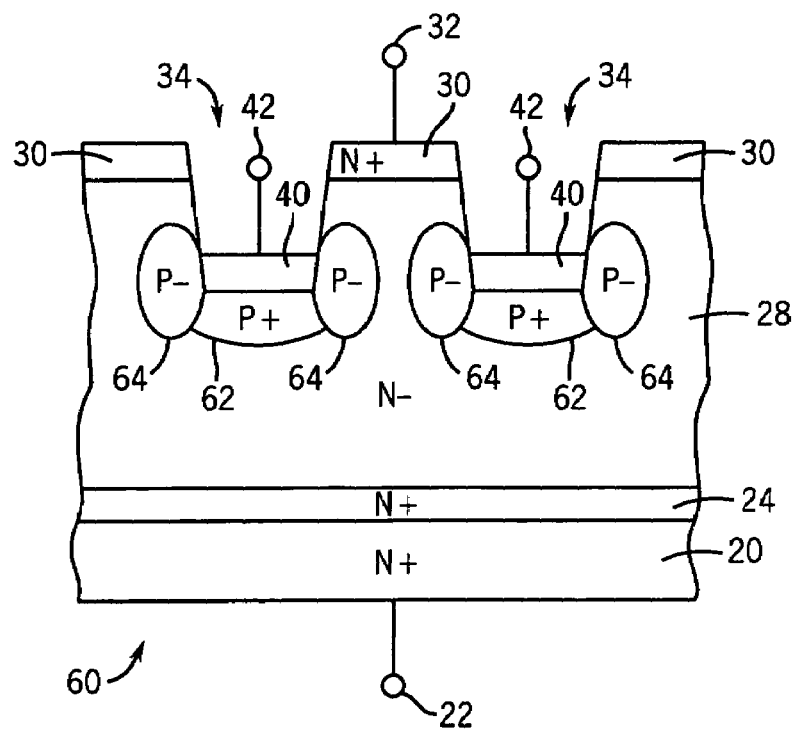
FIG. 4 illustrates a cross-sectional view of a third embodiment of vertical power JFET with P− regions on either side of the P+ regions.

In FIG. 4, a cross-sectional view of vertical JFET 60 is shown. Semiconductor regions 62 are disposed in epi region 28 below gate structures 40. Semiconductor regions 60 are heavily doped with p-type semiconductor material, for example 1019 atoms boron/$cm^3$ and, as such, are designed as P+ regions 62. In one embodiment, P+ regions 62 make physical contact with gate structures 40.

Semiconductor regions 64 are implanted in epi region 28, adjacent to either side of P+ regions 60. Semiconductor regions 64 are lightly doped with p-type semiconductor material, for example $10^{15}$ atoms boron/$cm^3$ and, as such, are designed as P– regions 64. In one embodiment, P–regions 64 extend upward adjacent to trenches 34, above the level of gate structures 40.

The above vertical JFET devices has disclosed various implementations of disposing extended or additional semiconductor material below the gate structures, which has opposite conductivity type as the epi region. The extended semiconductor regions, e.g., P– regions 36 under P+ region 38 or deep P+ region 50, give the JFET structures lower $R_{DSon}$, while maintaining higher breakdown or isolation voltages.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
   a first gate region;
   an epitaxial region having a first conductivity type;
   a first region disposed within the epitaxial region, under the first gate region and extending at least half way through the epitaxial region, wherein the first region has a second conductivity type opposite the first conductivity type;
   a second gate region;
   a second region disposed within the epitaxial region, under the second gate region and extending at least half way through the epitaxial region, wherein the second region has the second conductivity type; and
   a third region disposed between the first and second regions and having the first conductivity type.

2. The semiconductor device of claim 1, further including a trench formed in the epitaxial region for disposing the first gate region within the trench.

3. The semiconductor device of claim 1, further including:
   a drain region disposed below the epitaxial region; and
   a source region disposed over a first portion of the epitaxial region.

4. The semiconductor device of claim 1, wherein the first conductivity type is N-type semiconductor material.

5. The semiconductor device of claim 1, wherein the first region is made with P+ semiconductor material.

6. A transistor having a gate region, drain region, and source region, comprising:
   an epitaxial region having a first conductivity type;
   a semiconductor material disposed within the epitaxial region, under the gate region and extending into tile epitaxial region of sufficient depth to reduce drain to source resistance of the transistor, wherein the semiconductor material has a conductivity type which is opposite the first conductivity type;
   a first region disposed within the epitaxial region, under a first portion of the gate region and extending at least half way through the epitaxial region; and
   a second region disposed within the epitaxial region, under a second portion of the gate region and extending at least half way through the epitaxial region.

7. The transistor of claim 6, wherein the transistor is a junction field effect transistor.

* * * * *

UNITED STATES PATENT AND TRADEMARK OFFICE
CERTIFICATE OF CORRECTION

| | | |
|---|---|---|
| PATENT NO. | : 7,235,827 B2 | Page 1 of 1 |
| APPLICATION NO. | : 10/828773 | |
| DATED | : June 26, 2007 | |
| INVENTOR(S) | : Badredin Fatemizadeh et al. | |

It is certified that error appears in the above-identified patent and that said Letters Patent is hereby corrected as shown below:

Column 6, Claim 6 at line 11, delete the word "tile" and replace with -- the --.

Signed and Sealed this

Fourteenth Day of August, 2007

JON W. DUDAS
*Director of the United States Patent and Trademark Office*